(12) United States Patent
Tu et al.

(10) Patent No.: US 8,450,749 B2
(45) Date of Patent: May 28, 2013

(54) LIGHT EMITTING ELEMENT AND MANUFACTURING METHOD THEREOF

(75) Inventors: Po-Min Tu, Hsinchu (TW); Shih-Cheng Huang, Hsinchu (TW); Shun-Kuei Yang, Hsinchu (TW); Chia-Hung Huang, Hsinchu (TW)

(73) Assignee: Advanced Optoelectronics Technology, Inc., Hsinchu Hsien (TW)

( * ) Notice: Subject to any disclaimer, the term of this patent is extended or adjusted under 35 U.S.C. 154(b) by 79 days.

(21) Appl. No.: 12/986,186

(22) Filed: Jan. 7, 2011

(65) Prior Publication Data

US 2011/0266552 A1 Nov. 3, 2011

(30) Foreign Application Priority Data

Apr. 29, 2010 (CN) .......................... 2010 1 0160110

(51) Int. Cl.
*H01L 33/30* (2010.01)
*H01L 33/44* (2010.01)

(52) U.S. Cl.
USPC .......... 257/76; 257/79; 257/86; 257/E33.025; 257/E33.068; 438/29; 438/31; 438/34

(58) Field of Classification Search
USPC .................. 257/76, 79, 86; 438/29, 31, 34
See application file for complete search history.

(56) References Cited

U.S. PATENT DOCUMENTS

| 5,124,780 A * | 6/1992 | Sandhu et al. ................ 257/344 |
| 2003/0207518 A1* | 11/2003 | Kong et al. .................... 438/200 |
| 2010/0102328 A1* | 4/2010 | Yoshida et al. ................. 257/76 |
| 2010/0265981 A1* | 10/2010 | Hiroyama et al. .......... 372/49.01 |

FOREIGN PATENT DOCUMENTS

WO 2009081762 A1 7/2009

* cited by examiner

*Primary Examiner* — Matthew W Such
*Assistant Examiner* — David Spalla
(74) *Attorney, Agent, or Firm* — Altis Law Group, Inc.

(57) ABSTRACT

A light emitting element includes a substrate, a GaN layer formed on the substrate, a first low refractive index semiconductor layer formed on the GaN layer, and a lighting structure having a high refractive index formed on the first low refractive index semiconductor layer. A second low refractive index semiconductor layer is embedded in the first low refractive index semiconductor layer. The first low refractive index semiconductor layer and the GaN layer exhibit a lattice mismatch therebetween.

10 Claims, 8 Drawing Sheets

LIGHT EMITTING ELEMENT AND MANUFACTURING METHOD THEREOF

BACKGROUND

1. Technical Field

The disclosure relates to light emitting elements, and particularly to a light emitting element with high light extraction efficiency.

2. Description of the Related Art

Light emitting diodes' (LEDs) many advantages, such as high luminosity, low operational voltage, low power consumption, compatibility with integrated circuits, easy driving, long term reliability, and environmental friendliness have promoted their wide use as a lighting source. Light emitting diodes are commonly applied in illumination apparatus.

Because optical paths of light from an active layer of common light emitting element are not perfect, light extraction and illumination efficiency of common light emitting elements can be limited, such that improving light extraction efficiency is an industry priority.

Therefore, it is desirable to provide a light emitting element with high light extraction efficiency which can overcome the described limitations.

BRIEF DESCRIPTION OF THE DRAWINGS

Many aspects of the disclosure can be better understood with reference to the drawings. The components in the drawings are not necessarily drawn to scale, the emphasis instead being placed upon clearly illustrating the principles of the present light emitting element with high light extraction efficiency. Moreover, in the drawings, like reference numerals designate corresponding parts throughout the views.

DETAILED DESCRIPTION

Embodiments of a light emitting element as disclosed are described in detail here with reference to the drawings.

Figure 1:
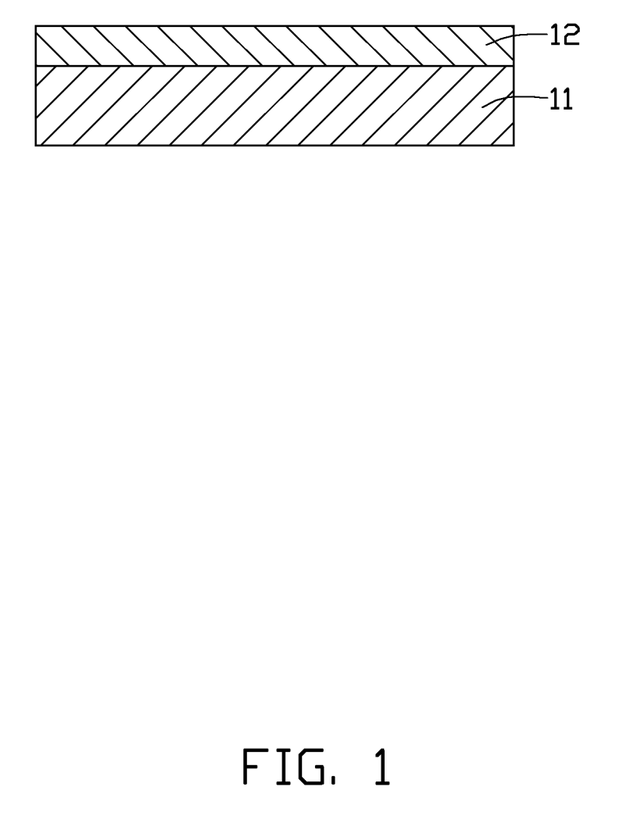
FIG. 1 is a schematic cross section of a GaN layer formed on a substrate of a first embodiment of a light-emitting element.
Figure 8:
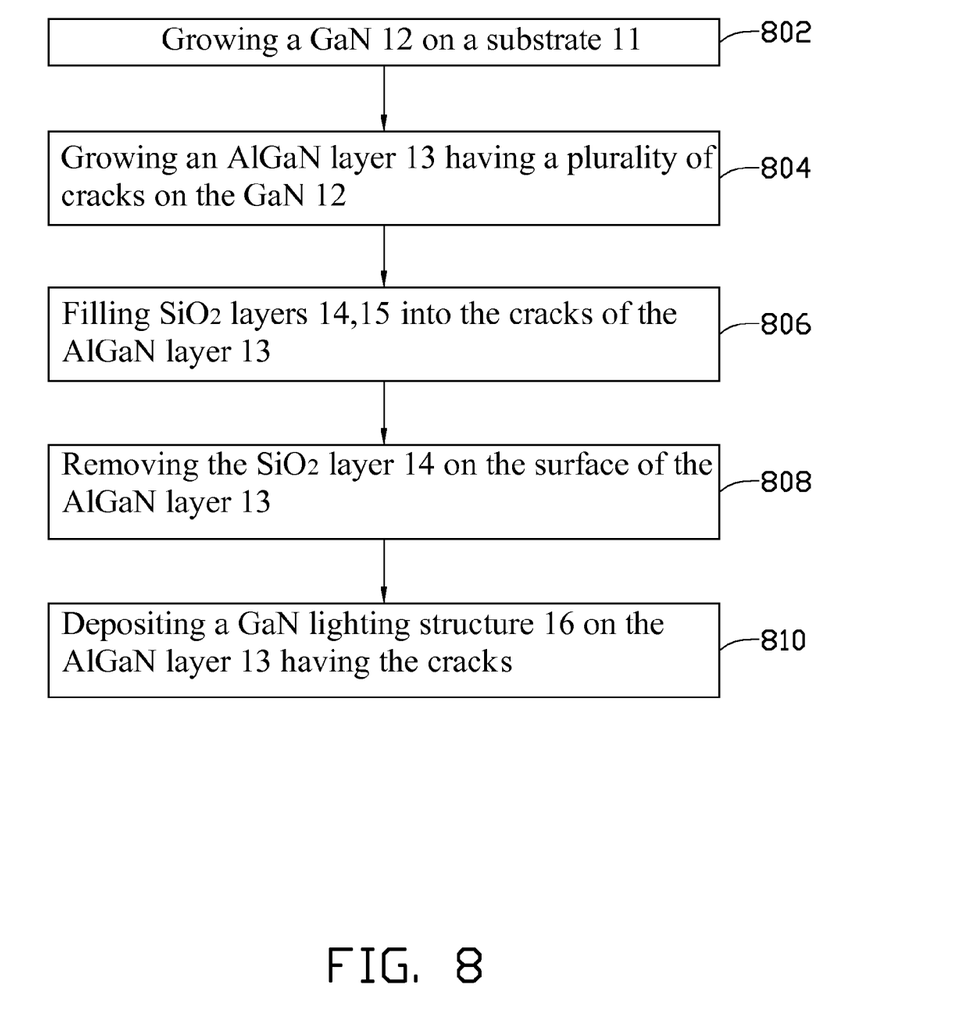
FIG. 8 is a flowchart of a processing method for manufacturing a light emitting element as disclosed.

Referring to FIG. 1 and step 802 of FIG. 8, a substrate 11 is provided and a GaN layer 12 is formed on the substrate 11 by Metal-Organic Chemical Vapor Deposition (MOCVD). The substrate 11 can be sapphire, GaN, CuW, Si, SiC, or AlN. In this embodiment, the substrate 11 is sapphire. A surface of the substrate 11 is cleaned, for example, by thermal cleaning in a $H_2$ environment at 1200° C. and passed into an ammonia ($NH_3$) gas and an element group MA organic metallic precursor. A metallic compound having aluminum (Al), gallium (Ga), or indium (In) is used as a metallic precursor, for example, trimethylaluminum (TMAl), triethylaluminum (TEAl), trimethylgalliaum (TMGa), triethylgallium (TEGa), trimethylindium (TMIn), and triethylindium (TEIn). By the MOCVD, a precursor of $N_2$ is $NH_3$ and a precursor of galliaum (Ga) is trimethylgallium. (TMGa) or triethylgllium (TEGa). The GaN layer 12 is formed on the substrate 11 at low or normal pressure of the reactor.

Figure 2:
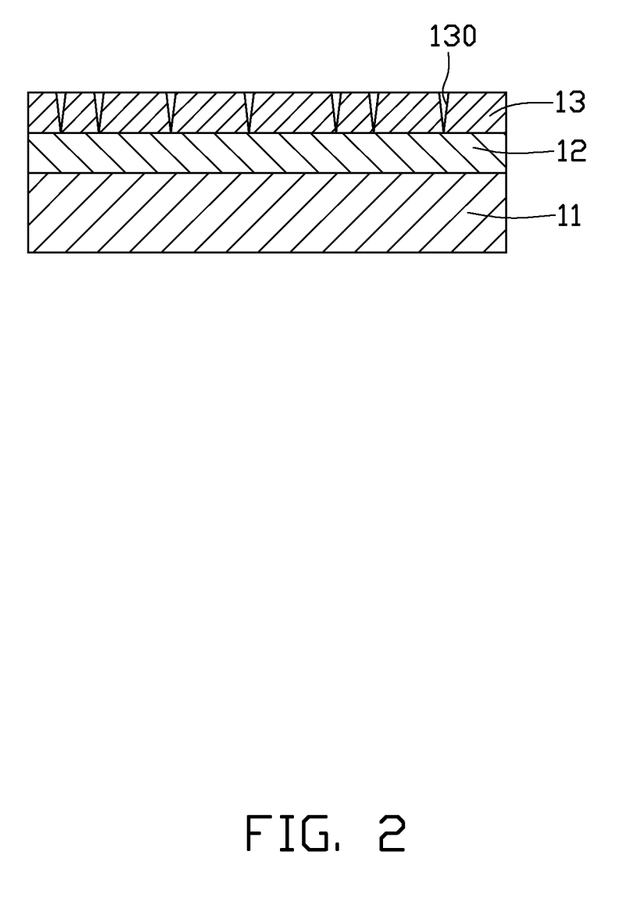
FIG. 2 is a schematic cross section of an AlGaN layer exhibiting a plurality of cracks on the GaN layer of FIG. 1.

Referring to step 804 of FIG. 8, an AlGaN layer 13 is deposited on the GaN layer 12. Moreover, the AlGaN layer 13 forms a plurality of natural cracks 130 simultaneously during growth. By adding a precursor of aluminum (Al), for example, trimethylaluminum (TMAl) or triethylaluminum (TEAl), the AlGaN layer 13 is formed on the GaN layer 12 as shown in FIG. 2.

The natural cracks 130 of the AlGaN layer 13 are due to lattice mismatch between the AlGaN layer 13 and the GaN layer 12, resulting from the epitaxial layer being formed on the substrate 11, and the epitaxial layer grown along the plane boundary of the substrate 11. However, when the lattice mismatch exists between the epitaxial layer and the substrate 11, the growth mechanism is substantially different. For example, the substrate 11 has a lattice constant $a_1$ and the epitaxial layer has a lattice constant $a_2$:

$$\Delta a/a_2 = (a_2 - a_1)/a_2$$

When only one or two crystals deform elastically, the structure between the two crystals will generate lattice match therebetween. When a thickness of the substrate 11 exceeds that of the epitaxial layer, the atoms of the epitaxial layer are displaced. When the crystal of the epitaxial layer deforms, the lattice constant of the epitaxial layer along the surface direction is equal to the lattice constant of the substrate 11. However, the lattice constant of the epitaxial layer perpendicular to a direction of substrate 11 will change due to Poisson effect. The lattice constant of the epitaxial layer parallel to the direction of surface produces a compressive strain by stress. The lattice constant of the epitaxial layer perpendicular to the substrate 11 increases. Conversely, the lattice constant parallel to the direction of surface produces a tensile strain due to stress. Thus, the lattice constant of the epitaxial layer perpendicular to the direction of substrate 11 is reduced.

Figure 3:
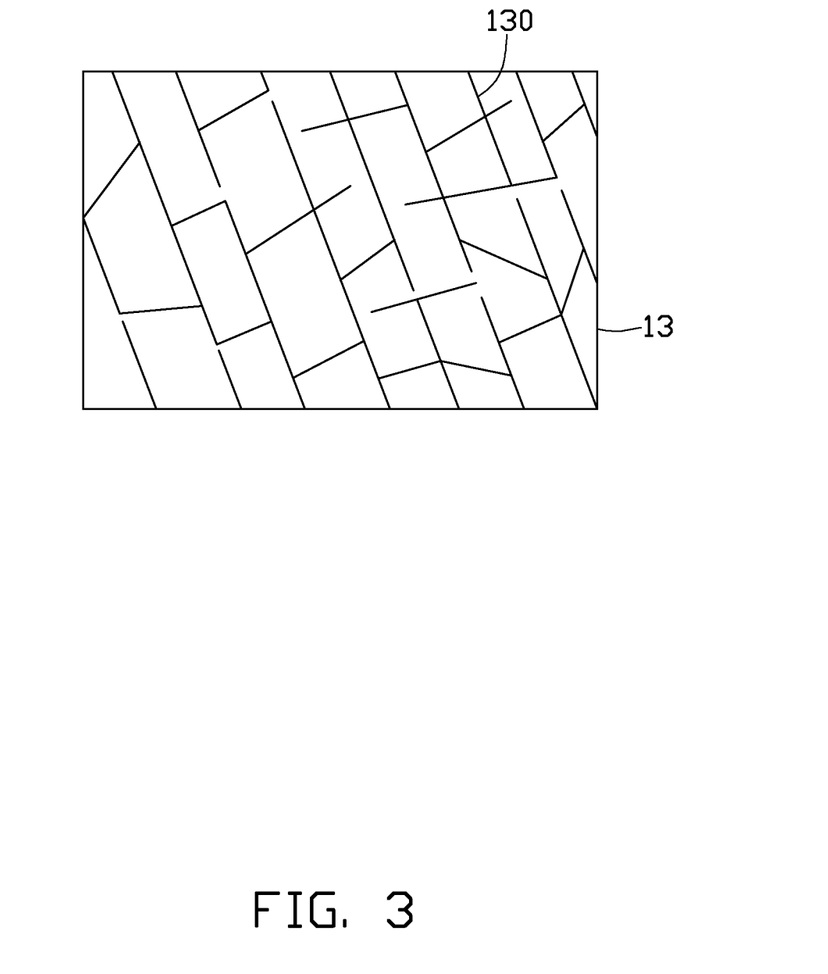
FIG. 3 is an enlarged top view of the AlGaN layer of FIG. 2.

Because the structure of the GaN layer 12 is Hexagonal and that of the AlGaN layer 13 is Wurtzite, the difference in lattice constant between the GaN layer 12 and the AlGaN layer 13 is substantially larger. Due to difference of the lattice constant between the GaN layer 12 and the AlGaN layer 13, the AlGaN layer 13 cracks naturally and forms the plurality of cracks 130, each no smaller than 1 μm and not exceeding 100 μm. FIG. 3 is a top view of the AlGaN layer 13, the cracks 130 of which are irregular. A distance between the two different cracks 130 is 1 μm to 100 μm. A width of the crack 130 is 1 nm to 10 μm. Moreover, a chemical formula of the AlGaN layer 13 is $Al_xGa_{1-x}N$, wherein $1>x>0$. A thickness d can be different according to a difference of a molar ratio of aluminum (Al).

Figure 4:
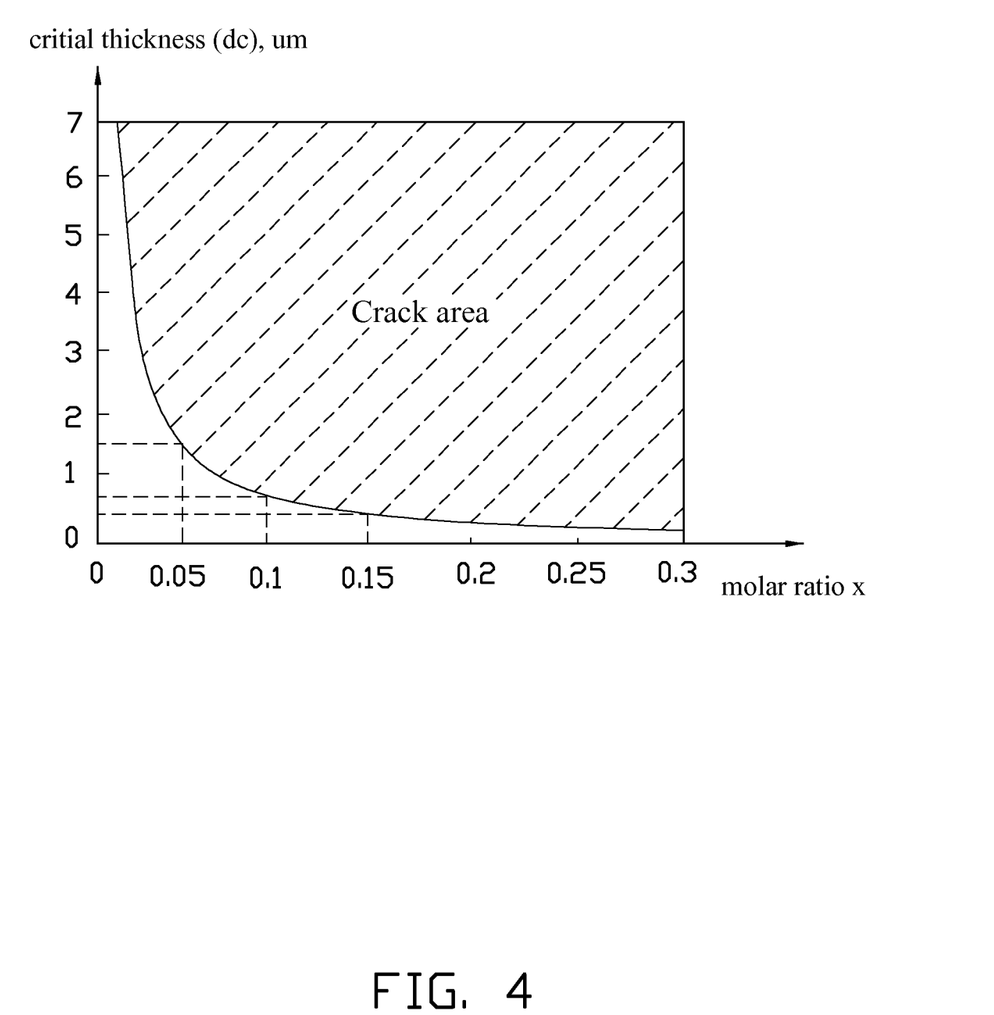
FIG. 4 is a relationship diagram of a critical thickness to aluminum quantity of the AlGaN layer of FIG. 2.

FIG. 4 shows a relationship curve between the molar ratio x of Al of the AlGaN layer 13 to a critical thickness (dc) of the AlGaN layer 13, wherein the critical thickness (dc) and the molar ratio x of Al is an inverse relationship. When the molar ratio x of Al of the AlGaN layer 13 is equal to 0.05, the critical thickness (dc) of the AlGaN layer 13 is equal to 1500 nm; when x=0.1, dc=700 nm; when x=0.2, dc=200 nm; when x=0.30, dc=90 nm. When the thickness d of the AlGaN layer 13 exceeds the critical thickness (dc), the relationship of the thickness d of the AlGaN layer 13 and the molar ratio x of Al of the AlGaN layer 13 is located in the crack area of FIG. 4. Thus, the AlGaN layer 13 cracks naturally. When x=0.05, d≧1500 nm, x=0.10, d≧700 nm, x=0.2, d≧200 nm, or x=0.3, d≧90 nm, the crack will form naturally inside the AlGaN layer 13.

Figure 5:
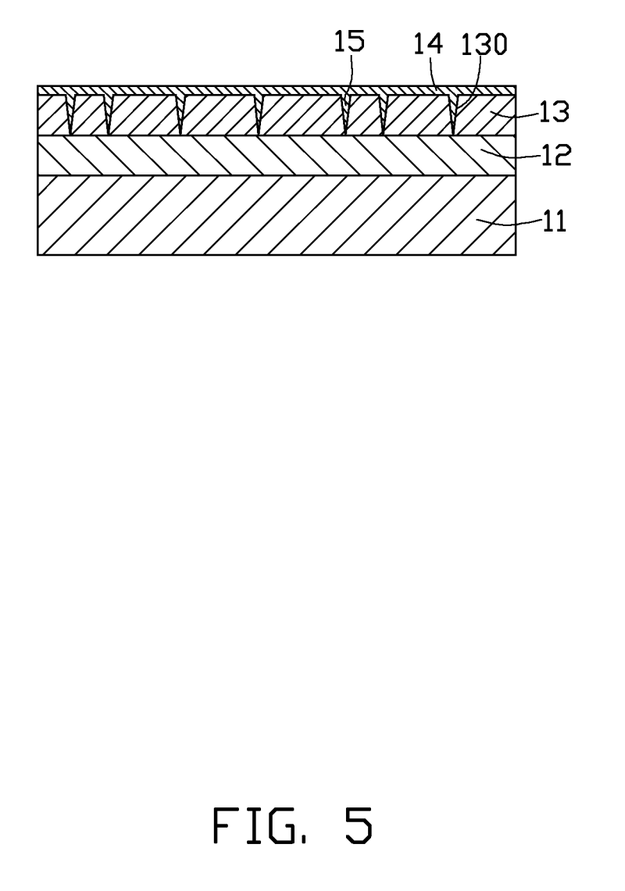
FIG. 5 is a schematic cross section of a $SiO_2$ layer deposited on the AlGaN layer of FIG. 2.

Referring to step 806 of FIG. 8, then SiO₂ layers 14 and 15 are filled into the cracks 130 of the AlGaN layer 13. Referring to FIG. 5, oxide layers are formed into the cracks 130 of the AlGaN layer 13 by chemical vapor deposition enhancing with plasma. The oxide layers are the SiO₂ layers 14, and 15 in this embodiment. The SiH₄ and O₂ are reacted in the reactor to form SiO₂ layers 14, and 15 at 100° C. During deposition at a lower temperature, the SiO₂ layer 15 is filled into the cracks 130, and the SiO₂ layer 14 covers an entire top surface of the AlGaN layer 13.

Figure 6:
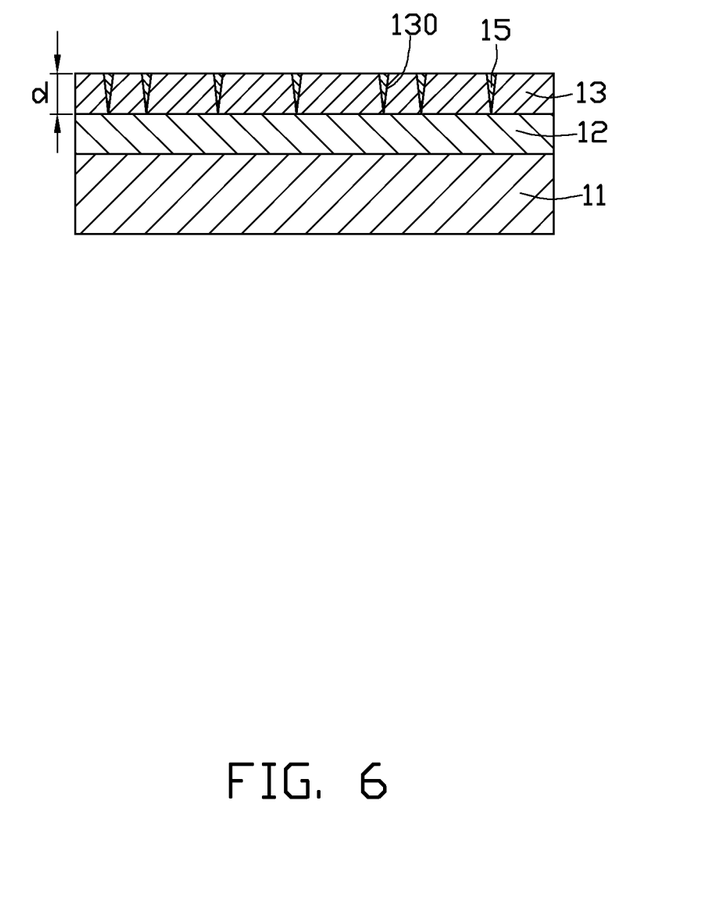
FIG. 6 is a schematic cross section after removal of the $SiO_2$ layer of FIG. 5.

Referring to FIG. 6 and step 808 of FIG. 8, the SiO₂ layer 14 on the AlGaN layer 13 is removed by Chemical Mechanical Polishing (CMP) or Inductively Coupled Plasma (ICP), and the SiO₂ layer 15 inside the AlGaN layer 13 is reserved. Thus, the top surface of the AlGaN layer 13 and the SiO₂ layer 15 embedded into the cracks 130 of the AlGaN layer 13 are exposed.

Figure 7:
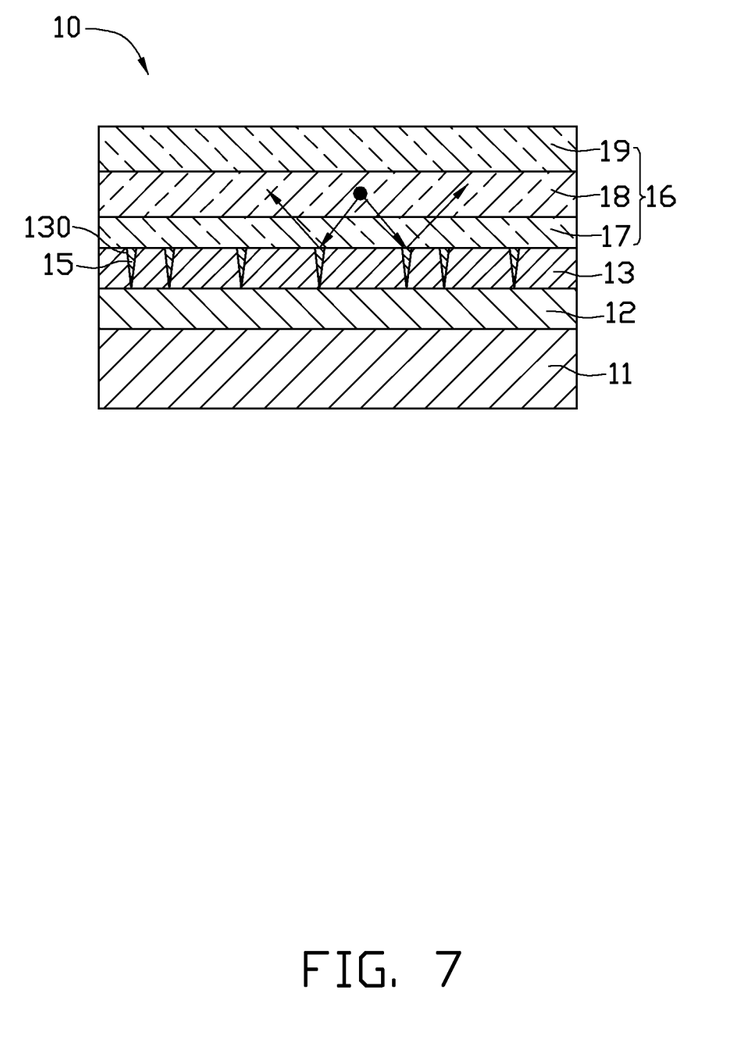
FIG. 7 is a schematic cross section of a GaN lighting structure formed on the AlGaN layer of FIG. 6.

Referring to FIG. 7 and step 810 of FIG. 8, a GaN lighting structure 16 is formed on the AlGaN layer 13 embedding the SiO₂ layer 15 by MOCVD or Molecular Beam Epitaxy (MBE). The SiO₂ layer 15 is a polycrystalline material.

In this embodiment, the GaN lighting structure 16 includes an n-type GaN semiconductor layer 17, a multiple quantum wells layer (MQWs) 18, and a p-type GaN semiconductor layer 19. During growth of the n-type GaN semiconductor layer 17, the n-type GaN semiconductor 17 adheres and grows first on the surface of the AlGaN layer 13. The n-type GaN semiconductor layer 17 starts to grow from the outside of the AlGaN layer 13. When the n-type GaN semiconductor layer 17 grows to a certain thickness, the growth mechanism changes to a lateral growth mechanism. The interface between the n-type GaN semiconductor layer 17 and the polycrystalline SiO₂ layer 15 is a discontinuous surface.

The epitaxial process decreases the defects of the structure. The N-type GaN semiconductor 17 is usually doped with group IV NA atoms, such as Si atoms. A precursor of Si can be SiH₄ or Si₂H₆ in the MOCVD.

The multiple quantum wells layer (MQWs) 18 can be a single heterostructure, double heterostructure, single quantum well, or multi-quantum well structure. The structure of the multi-quantum wells layer and barrier layer are mostly used. The quantum wells layer can be InGaN, and the barrier layer can be AlGaN. A Quaternary $Al_xIn_yGa_{1-x-y}N$ can be also the quantum wells layer and the barrier layer simultaneously.

The p-type GaN semiconductor 19 is doped with group II A atoms, such as magnesium (Mg), and a precursor of magnesium (Mg) can be CP₂Mg in the MOCVD.

Referring to FIG. 7, the light emitting element 10 includes the sapphire substrate 11, the GaN layer 12, the AlGaN layer 13 having the SiO₂ layer 15 and the GaN lighting structure 16. A refractive index of the AlGaN layer 13 is from 2.1 to 2.4, and that of the SiO₂ layer 15 is 1.466, and that of GaN is 2.4. The refractive index of the n-type GaN semiconductor layer 17 of the GaN lighting structure 16 relatively exceeds the AlGaN layer 13 embedding the SiO₂ layer 15. Light from the multi-quantum wells structure 18 travels through the n-type GaN semiconductor layer 17 to the SiO₂ layer 15. Total internal reflection easily occurs when the light travels from a medium with a higher reflective index to that with a lower reflective index. Because the refractive index of GaN (2.4) is substantially higher than that of the SiO₂ layer 15 (1.466), most light from the multi-quantum wells layer 18 traveling through the AlGaN layer 13 having the SiO₂ layer 15 is reflected upwardly to a light emitting surface, avoiding the material absorbing the light and enhancing light extraction efficiency.

Furthermore, because the cracks of the AlGaN layer 13 substantially release the stress of the multi-quantum wells layer 18, the Quantum-Confined Stark Effect (QCSE) decreases and the lattice quality of the light emitting element improves.

While the disclosure has been described by way of example and in terms of exemplary embodiment, it is to be understood that the disclosure is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A light emitting element, comprising:
   a substrate;
   a GaN layer on the substrate;
   a first low refractive index semiconductor layer on the GaN layer, the first low refractive index semiconductor layer having a first top surface;
   a second low refractive index semiconductor layer embedded in the first low refractive index semiconductor layer, the second low refractive index semiconductor layer having a second top surface; and
   a lighting structure having a high refractive index on the first top surface of the first low refractive index semiconductor layer and the second top surface of the second low refractive index semiconductor layer, wherein a lattice mismatch exists between the first low refractive index semiconductor layer and the GaN layer, the lighting structure being a GaN lighting structure including an n-type GaN semiconductor layer on the first and second top surfaces of the first and second low refractive index semiconductor layers, a multiple quantum wells layer (MQWs) on the n-type GaN layer, and a p-type GaN semiconductor layer on the multiple quantum wells layer;
   wherein light generated by the multiple quantum wells layer toward the substrate is reflected by the first top surface of the first low refractive index semiconductor layer and the second top surface of the second low refractive index semiconductor layer embedded in the first low refractive index semiconductor layer; and
   wherein a size of each of the cracks of the second low refractive index semiconductor layer is not less than 1 μm and not exceeding 100 μm.

2. The light emitting element of claim 1, wherein the first low refractive index semiconductor layer is an AlGaN layer, and the second low refractive index semiconductor layer is a SiO₂ layer.

3. The light emitting element of claim 1, wherein the lighting structure having a high refractive index is a GaN lighting structure.

4. The light emitting element of claim 1, wherein the first low refractive index semiconductor layer has a plurality of cracks for embedding the second refractive index semiconductor layer.

5. A method for manufacturing a light emitting element, including steps:
   providing a substrate;
   forming a GaN layer on the substrate;
   forming a first low refractive index semiconductor layer having a plurality of cracks on the GaN layer;

forming a second low refractive index semiconductor layer on the first low refractive index semiconductor layer, the second low refractive index semiconductor layer covering the first low refractive index semiconductor layer and filling the cracks of the first low refractive index semiconductor layer;

removing a portion of the second low refractive index semiconductor layer on the first low refractive index semiconductor layer for exposing a first top surface of the first low refractive index semiconductor layer and a second top surface of another portion of the second low refractive index semiconductor layer which is in the cracks; and forming a lighting structure having a high refractive index on the first top surface of the first low refractive index semiconductor layer and the second top surface of the another portion of the second low refractive index semiconductor layer in the cracks.

6. The method for manufacturing the light emitting element of claim 5, wherein the lighting structure with a high refractive index is a GaN lighting structure.

7. The method for manufacturing the light emitting element of claim 5, wherein the first low refractive index semiconductor layer is an AlGaN layer, and the second low refractive index semiconductor layer is a $SiO_2$ layer.

8. The method for manufacturing the light emitting element of claim 7, wherein the cracks of the AlGaN layer are naturally formed during the formation of the first low refractive index semiconductor layer.

9. The method for manufacturing the light emitting element of claim 8, wherein a size of each of the cracks is not less than 1 μm and not exceeding 100 μm.

10. The method for manufacturing the light emitting element of claim 8, wherein a lattice mismatch exists between the GaN layer and the first low refractive index semiconductor layer.

* * * * *